United States Patent [19]
Thurairajaratnam et al.

[11] Patent Number: 5,903,050
[45] Date of Patent: May 11, 1999

[54] SEMICONDUCTOR PACKAGE HAVING CAPACITIVE EXTENSION SPOKES AND METHOD FOR MAKING THE SAME

[75] Inventors: Aritharan Thurairajaratnam, Fremont; Wheling Cheng, Palo Alto; Scott L. Kirkman, Redwood, all of Calif.

[73] Assignee: LSI Logic Corporation, Milpitas, Calif.

[21] Appl. No.: 09/070,671

[22] Filed: Apr. 30, 1998

[51] Int. Cl.[6] .......................... H01L 23/52; H01L 23/48; H01L 23/495
[52] U.S. Cl. .......................... 257/695; 257/691; 257/670; 257/666
[58] Field of Search ...................................... 257/695, 666, 257/691, 670; 438/123; 361/813

[56] References Cited

U.S. PATENT DOCUMENTS 5,519,576 5/1996 Moore ...................................... 257/666
5,672,909 9/1997 Glenn et al. .............................. 257/700
5,691,568 11/1997 Chou et al. ............................... 257/700

*Primary Examiner*—Mahshid Saadat
*Assistant Examiner*—Jhihan B. Clark

[57] ABSTRACT

Disclosed is a pair of conductive rings and method for making the conductive rings for introducing an integral network of capacitive structures around a semiconductor die of a semiconductor package. The pair of conductive rings include a ground rail ring that is defined around a semiconductor die pad that is configured to receive a semiconductor die. The ground rail ring has a first plurality of extension spokes that extend away from the ground rail ring. The pair of conductive rings further includes a power rail ring that is defined around the semiconductor die pad. The power rail ring has a second plurality of extension spokes that extend away from the power rail ring and toward the ground rail ring.

8 Claims, 5 Drawing Sheets

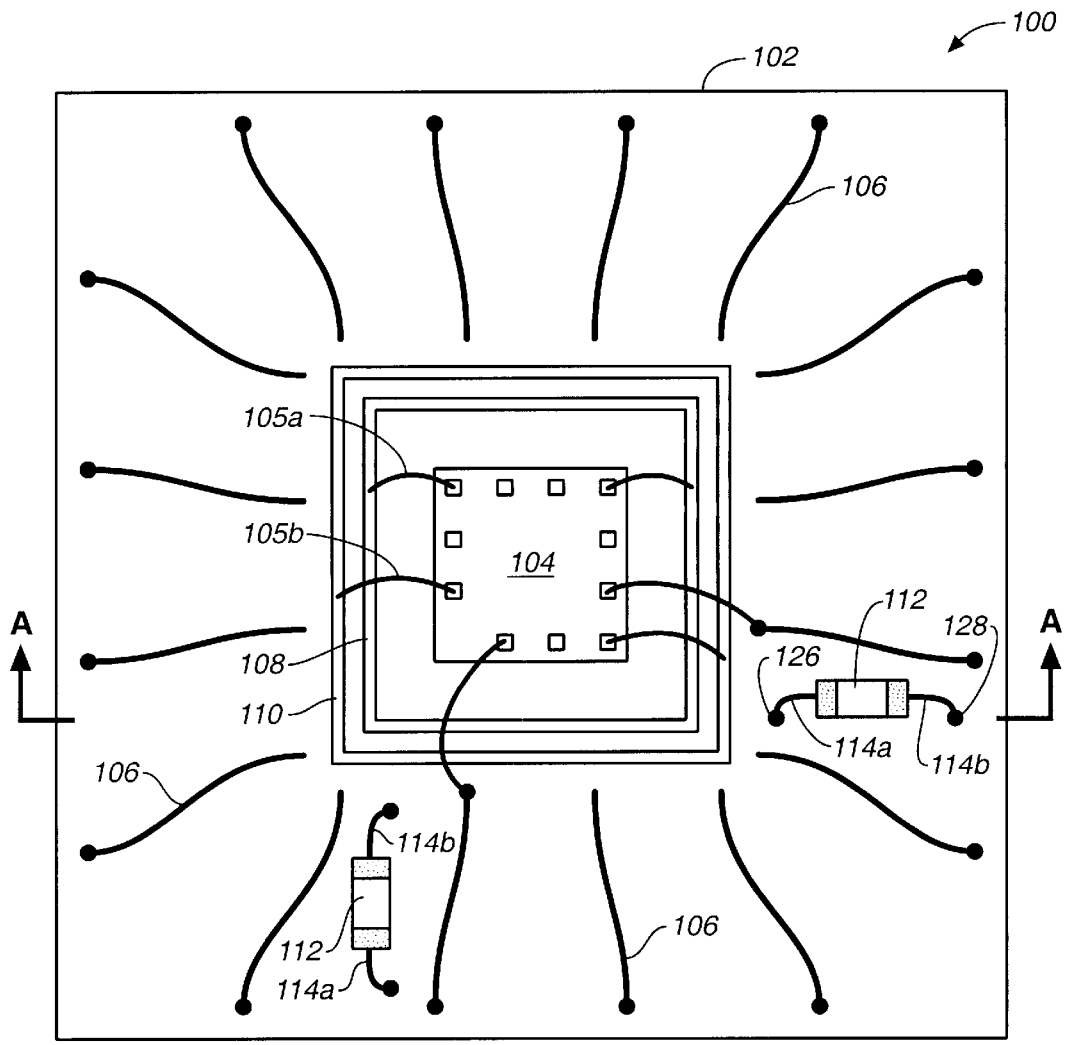
FIG._1A (PRIOR ART)
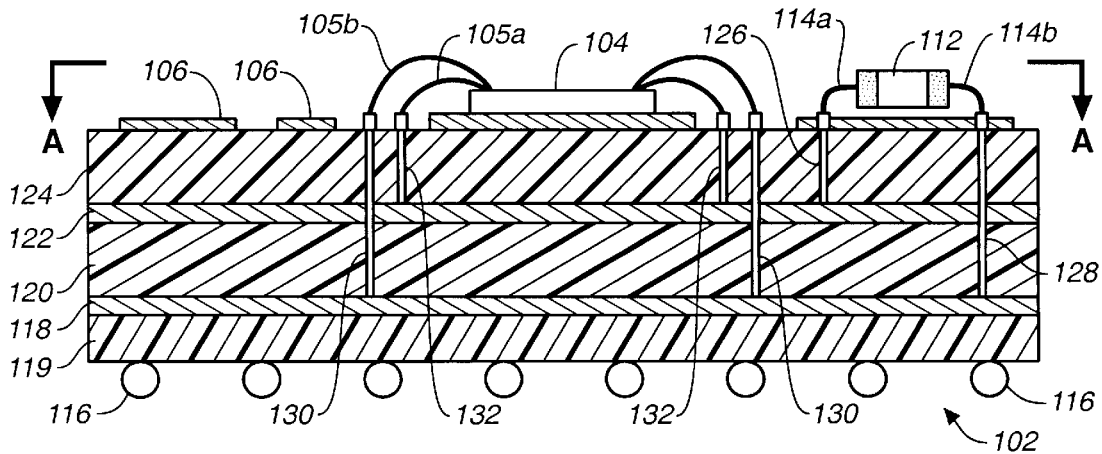
FIG._1B (PRIOR ART)

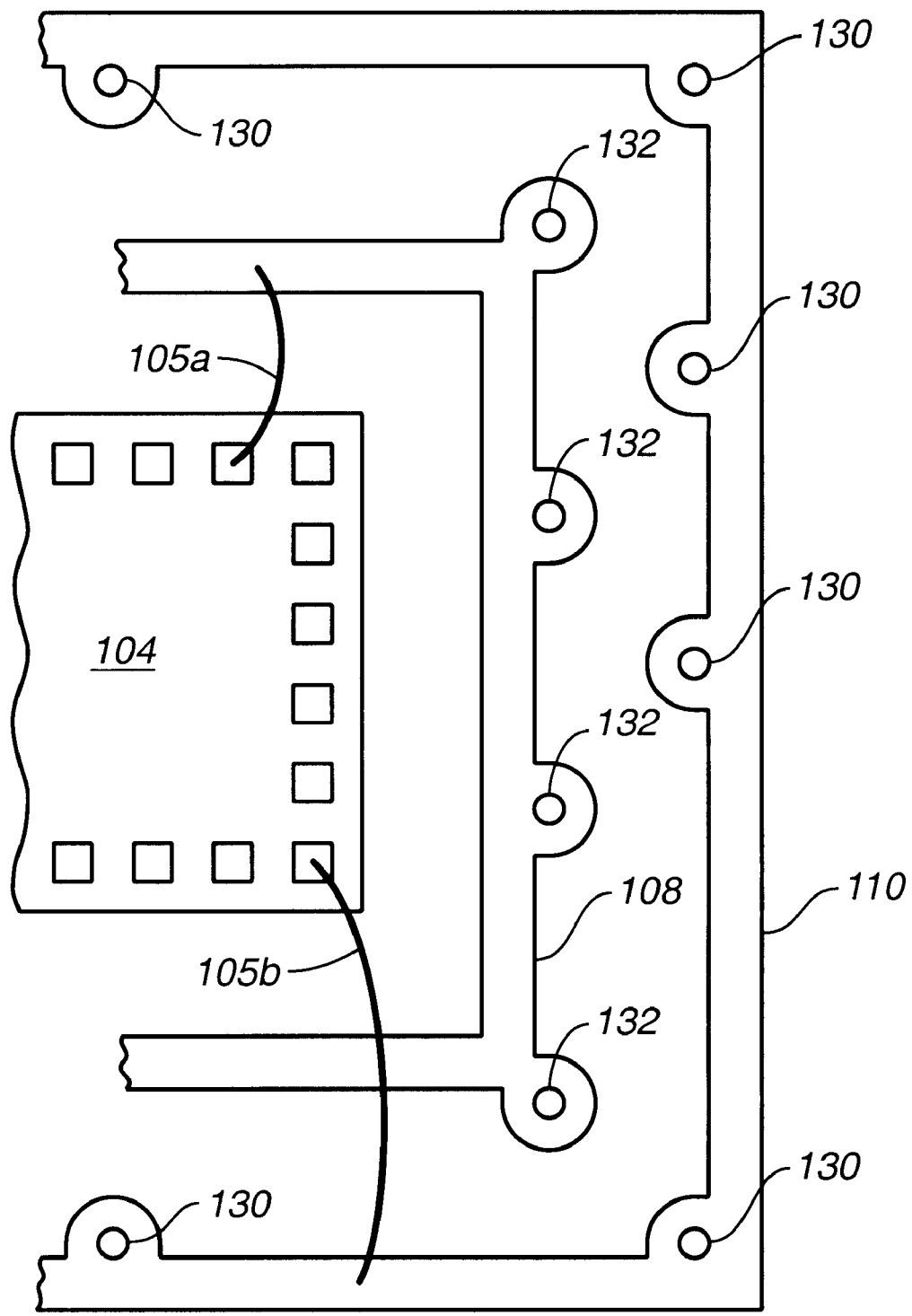
FIG._1C
*(PRIOR ART)*

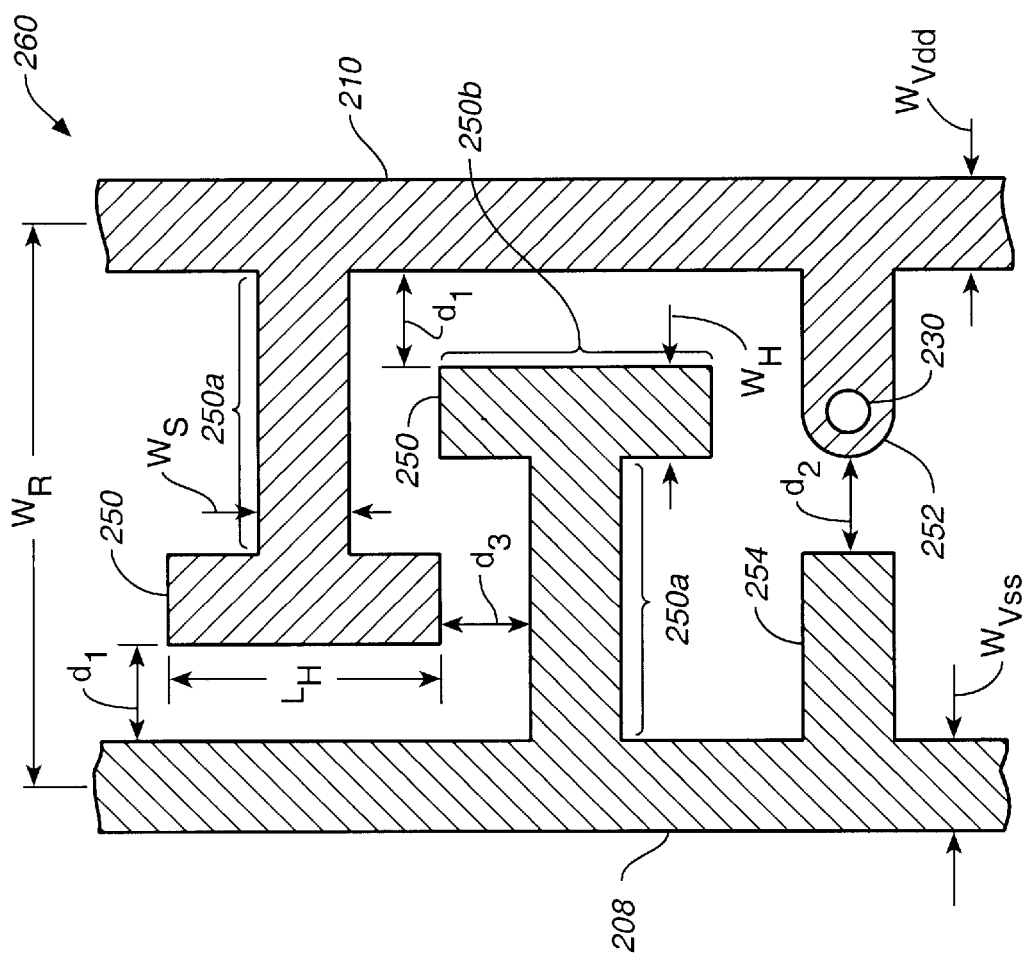
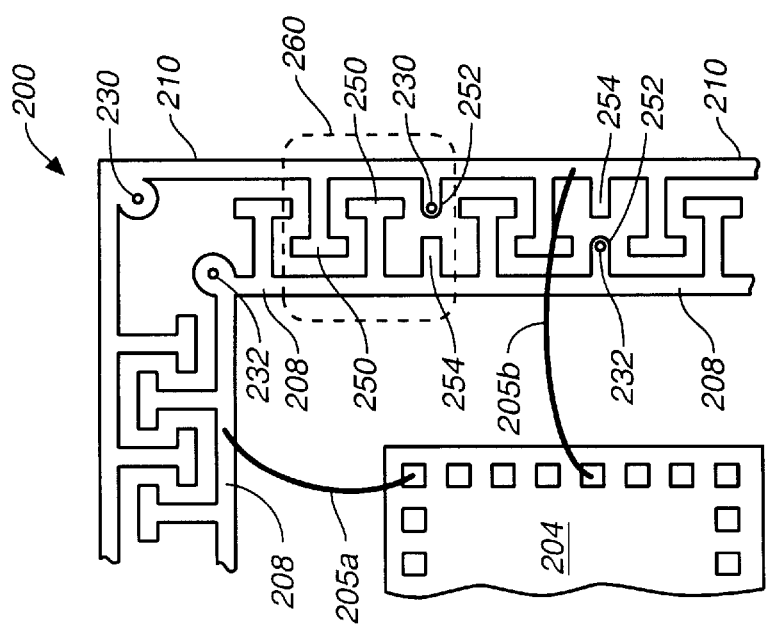

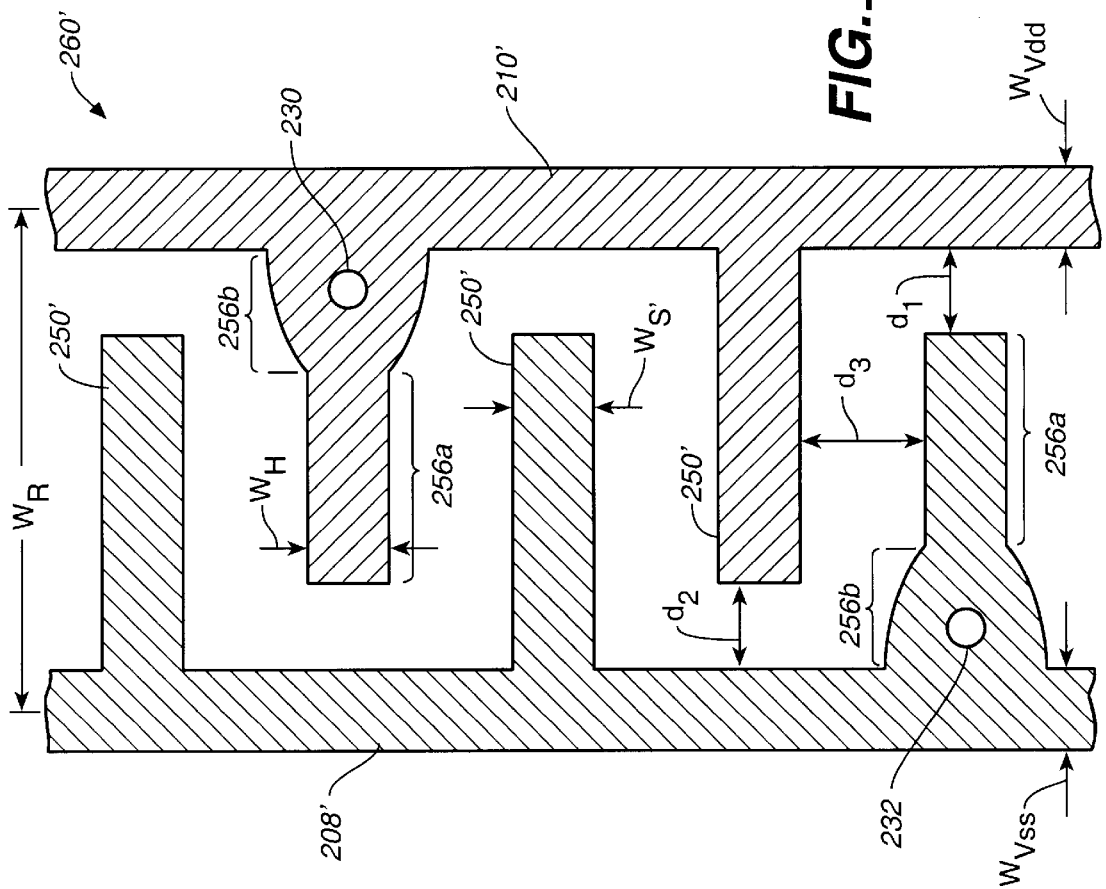
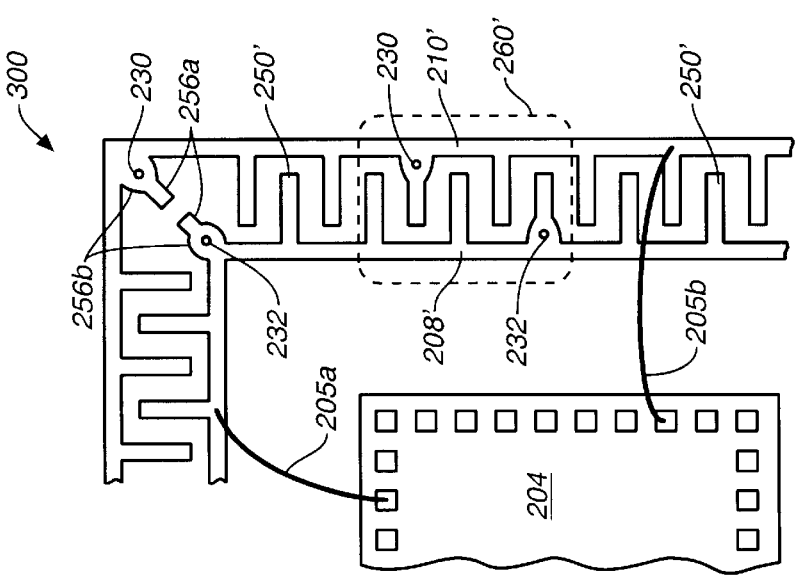
FIG._3A
FIG._3B

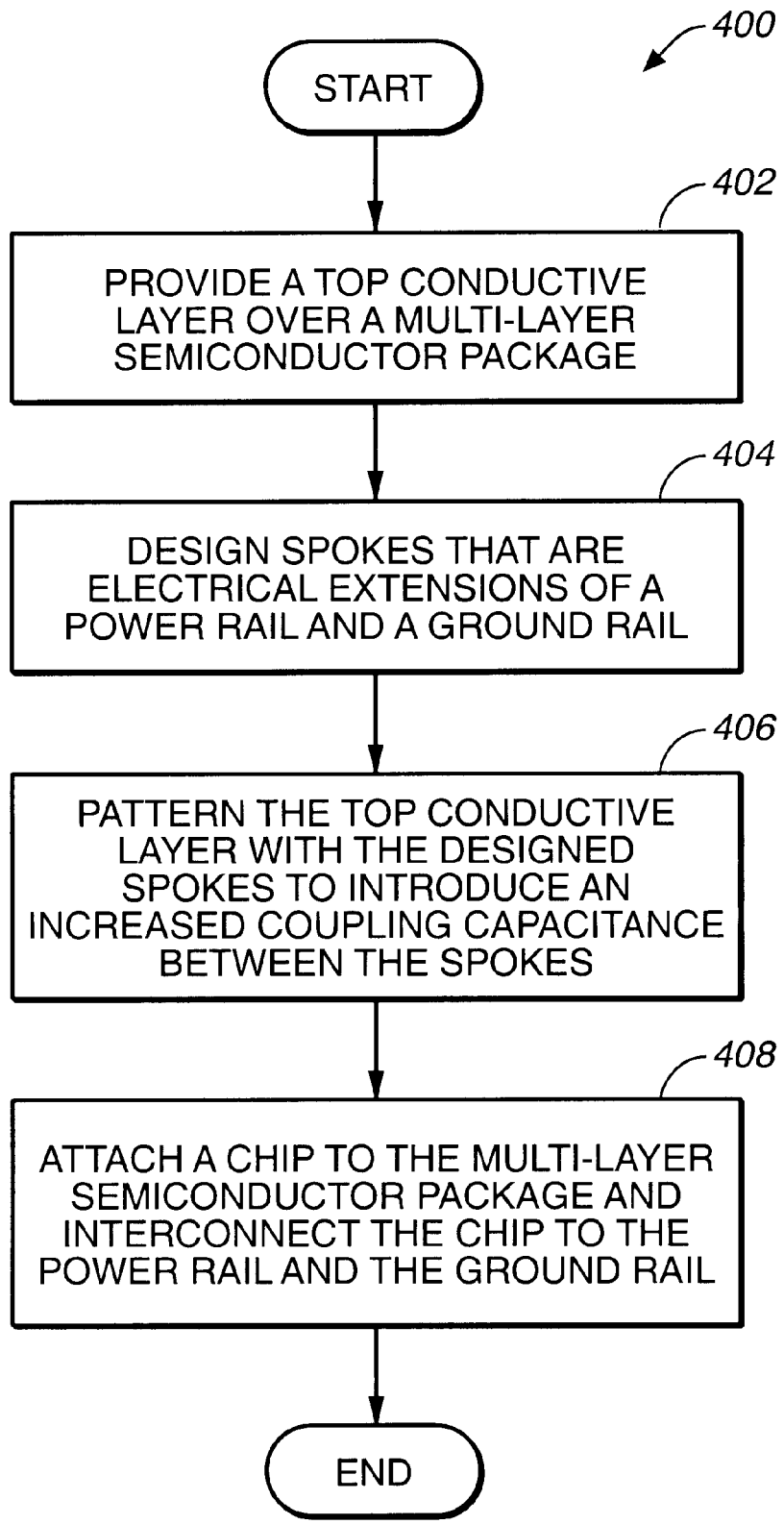
FIG._4

SEMICONDUCTOR PACKAGE HAVING CAPACITIVE EXTENSION SPOKES AND METHOD FOR MAKING THE SAME

BACKGROUND OF THE INVENTION

1. Field of the Invention

The present invention relates generally to semiconductor package technology and, more particularly, to techniques for designing bypass capacitive structures between power and ground rails of a semiconductor package.

2. Description of the Related Art

As device operating speeds and the slew rates of driver switching simultaneously increase, the quality of the power $V_{dd}$ and ground $V_{ss}$ routing systems become a critical factor in the overall integrity of the system. In current designs, providing a source of charge in close vicinity of the switching activity is essential for the proper functioning of an overall integrated circuit system.

In the prior art, a common way of providing a reservoir of charge near switching circuitry (i.e., I/O driver circuitry) has been to mount discrete capacitive components between the power $V_{dd}$ and the ground $V_{ss}$ lines. As a result, prior art system have been able to somewhat improve a system's electrical performance. These discrete capacitors are usually mounted on a package substrate and then directly interconnected to the power $V_{dd}$ and ground $V_{ss}$ through conductive leads and vias.

However, a major problem with using discrete capacitors to decouple the system $V_{dd}$ and $V_{ss}$ lines is that they lose their effectiveness at high frequencies. Furthermore, there is often not enough space on the semiconductor package surface to mount a larger number of discrete capacitors that may be necessary to decouple the system.

An example of a typical semiconductor package is shown in FIG. 1A. FIG. 1A shows a semiconductor package 100 having a package substrate 102. A semiconductor chip 104 is mounted on the package substrate 102. A plurality of conductive traces 106 are routed on the package substrate 102. A ground rail $V_{ss}$ ring 108 is routed on the package substrate 102 and connected to the semiconductor chip 104 by a plurality of bond wires 105a. A power rail $V_{dd}$ ring 110 is also routed on the package substrate 102 and connected to the semiconductor chip 104 by another plurality of bond wires 105b.

For ease of illustration, only four bond wires are shown, but as is well known in the art, many more bond wires 105a and 105b are used to provide appropriate connections between semiconductor chip 104 and ground rail ring $V_{ss}$ 108 and power rail $V_{dd}$ ring 110. A discrete capacitor 112 having conductive leads 114a and 114b is mounted to the package substrate 102. In this example, only two discrete capacitors are shown mounted on the package substrate 102. However, in order to provide sufficient charge near driver circuits of the semiconductor chip 104, many more discrete capacitors 112 should be mounted on the package substrate 102.

Although more discrete capacitors 112 can be added to the package substrate 102, because discrete capacitors 112 are relatively large components, there is typically not enough space on the package substrate 102 surface to mount the number of discrete capacitors 112 necessary to provide a sufficiently close charge storage location and an adequate level of decoupling for the power $V_{dd}$ and ground $V_{ss}$ lines. As will be discussed further below, the conductive leads 114a and 114b may also exhibit unacceptably high levels of impedance at high frequencies, which necessarily reduce the effectiveness of the discrete capacitors 112.

FIG. 1B is a cross-sectional view A—A of FIG. 1A, which illustrates the respective layers of the semiconductor package 100. The packaging substrate 102 is made up of several layers including solder balls 116, a power plane $V_{dd}$ 118, a ground plane $V_{ss}$ 122 and dielectric layers 119, 120 and 124. Conductive leads 114a and 114b are connected to conductive vias 126 and 128. In the same manner, bond wires 105a and 105b are connected to conductive vias 130 and 132. The conductive vias 126 and 132 are defined through the dielectric layer 124 and connect to the ground plane $V_{ss}$ 122. In the same manner, the conductive vias 128 and 130 are defined through the ground plane $V_{ss}$ 122 and dielectric layers 120 and 124 to connect to the power plane $V_{dd}$ 118.

FIG. 1C shows a simplified partial top view of a ground rail $V_{ss}$ ring 108 and a power rail $V_{dd}$ ring 110 with their respective conductive vias 130 and 132. In this manner, the semiconductor chip 104 is able to interconnect to the ground plane $V_{ss}$ 122 and the power plane $V_{dd}$ 118 through respective bond wires 105a and 105b.

As can be appreciated even more in FIG. 1B, only a limited number of discrete capacitors 112 can be mounted onto the packaging substrate 102. Conductive leads 114a and 114b with their respective vias 126 and 128 define conductive paths to the power plane $V_{dd}$ 118 and the ground plane $V_{ss}$ 122. These paths exhibit high impedance at high frequencies. Therefore, conventional devices are generally not able to provide low impedance paths between the power plane $V_{dd}$ 118 and the ground plane $V_{ss}$ 122.

Another problem with the use of conventional discrete capacitive components is that on-chip driver circuitry, which is required to switch at fast speeds, typically accesses an amount of charge that is stored in the discrete capacitors 112. Unfortunately, the distance between the discrete capacitors 112 and a selected on-chip driver circuit will be different, depending on the placement of the discrete capacitor on the package substrate. As is well known, as the distance between the driver circuitry and the stored charge increases, the speed at which on-chip driver circuitry (and other circuit components) operates will necessarily slow down. This therefore detrimentally impacts on the performance on any semiconductor chip 104 that may be mounted on the package.

In view of the foregoing, it is desirable to have a method and apparatus that provides for a low impedance path between the power $V_{dd}$ and ground $V_{ss}$ lines, and remain efficient at high frequency. It is also desirable to have a device that can be installed easily into the semiconductor package without being limited to the space available on the package substrate.

SUMMARY OF THE INVENTION

Broadly speaking, the present invention fills these needs by providing an apparatus and method for designing bypass capacitive structures between power and ground rails of semiconductor packages. It should be appreciated that the present invention can be implemented in numerous ways, including as a process, an apparatus, a system, a device or a method. Several inventive embodiments of the present invention are described below.

In one embodiment, a pair of conductive rings defined in a semiconductor package are disclosed. The pair of conductive rings include a ground rail ring that is defined around a semiconductor die pad that is configured to receive a semiconductor die. The ground rail ring has a first plurality of extension spokes that extend away from the ground rail ring. The pair of conductive rings further includes a power rail ring that is defined around the semiconductor die pad. The power rail ring has a second plurality of extension spokes that extend away from the power rail ring and toward the ground rail ring.

In another embodiment, a method for making a multi-layer semiconductor package is disclosed. The method includes: (a) providing a top conductive layer over the multi-layer semiconductor package; (b) designing a plurality of extension spokes that are electrical extensions of a power rail ring and a ground rail ring; and (c) patterning the top conductive layer to define the power rail ring and the ground rail ring, such that the plurality of extension spokes bring a first surface area of the power rail ring capacitively close to a second area of the ground rail ring.

In yet another embodiment, a power and ground providing structure defined in a semiconductor package is disclosed. The structure includes a ground ring means that is defined around a semiconductor die pad that is configured to receive a semiconductor die. The ground ring means has a first plurality of extension spokes that extend away from the ground ring means. The structure further includes a power ring means that is defined around the semiconductor die pad. The power ring means has a second plurality of extension spokes that extend away from the power ring means and toward the ground ring means.

One advantage of the present invention is that capacitive coupling between the power and ground rails of a semiconductor package can be produced without mounting discrete capacitors on the package substrate. Because the extension spokes are built-in electrical extensions of the power and ground rails, they are not limited by the constraints of using discrete components. More specifically, discrete capacitors are limited by the amount of space on the package substrate, so that it may be impossible to mount the number of capacitors needed to effectively decouple the power and ground rails. Furthermore, because there is no need for additional discrete capacitors on the package substrate, the size of the substrate itself can be reduced. Finally, by avoiding the use of discrete components, the cost of the device may also be decreased.

An additional advantage of the present invention is that the extension spokes do not experience high levels of additional impedance at high frequency. Discrete capacitors are connected by vias and leads to the power and ground planes. As described with reference to the prior art, these vias and leads exhibit additional impedance at high frequencies, thereby reducing the effectiveness of the capacitor. Because the extension spokes are built into the power and ground rails, they do not require long pathways to decouple the rails. Therefore, the extension spokes eliminate the problem of high impedance at high frequency exhibited by the prior art.

An additional advantage of the present invention is that the switching speed of the semiconductor chip is increased because the long pathways previously required to access charge are no longer used. Furthermore, the pervasiveness of the extension spokes in the present invention eliminates the possibility that the discrete capacitor is located far away from a point around either the power or ground rail. Instead, the on chip driver circuitry or other switching circuitry will be able to access about the same amount of stored charge from any point around both rails.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

FIG. 1A shows a top simplified view of a semiconductor package having a package substrate.

FIG. 1B is a cross-sectional view A—A of FIG. 1A, which illustrates the respective layers of a semiconductor package.

FIG. 1C shows a simplified partial top view of a ground rail Vhd ssring and a power rail $V_{dd}$ ring with their respective conductive vias.

FIG. 2A shows a simplified partial top view of a preferred embodiment of a bypass capacitive network.

FIG. 2B shows a more detailed view of the bypass capacitive network of FIG. 2A.

FIG. 3A shows a simplified partial top view of an alternative preferred embodiment of a bypass capacitive network.

FIG. 3B shows a more detailed view of the alternative bypass capacitive network of FIG. 3A.

FIG. 4 shows flow chart of a method for making a semiconductor package having a bypass capacitive network in accordance with one embodiment of the present invention.

DETAILED DESCRIPTION OF THE PREFERRED EMBODIMENTS

The present invention provides an apparatus and method for designing bypass capacitive structures between power and ground rails of a semiconductor package. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

FIG. 2A shows a simplified partial top view of a preferred embodiment of a bypass capacitive network 200. In this preferred embodiment, a semiconductor chip 204 is mounted on a package substrate (not shown for ease of illustration), which can be a ball grid array (BGA) package substrate, or a pin grid array (PGA) package substrate. The semiconductor chip 204 is connected to a ground rail $V_{ss}$ ring 208 and a power rail—$V_{dd}$ ring 210 through respective bond wires 205a and 205b.

A first plurality of extension spokes 250 are designed to bring a portion of the ground rail $V_{ss}$ ring 208 toward the power rail $V_{dd}$ ring 210, and a second plurality of extension spokes 250 are designed to bring a portion of the power rail $V_{dd}$ ring 210 toward the ground rail $V_{ss}$ ring 208. As can be appreciated, both pluralities of extension spokes 250 enable the complementary exposure of a much greater surface area between the two rings, which collectively act as a well distributed network of capacitive plates. This is because the capacitance between two parallel conductors is substantially proportional to the total surface area exposed between them. In this preferred embodiment, the extension spokes 250 are shown to be substantially T shaped extensions that are interposed between one another.

A first plurality of via stubs 252 and a first plurality of capacitive stubs 254 extend away from the ground rail $V_{ss}$ ring 208 towards one of a complementary plurality of via stubs 252 and a plurality of complementary capacitive stubs 254 that extend away from the power rail $V_{dd}$ ring 210. Conductive vias 230 and 232 are defined on both the first and the second plurality of via stubs 252.

As shown, both pluralities of via stubs 252 and capacitive stubs 254 provide an additional level of exposed complementary surfaces areas, which further add to the capacitive network formed by the extension spokes 250. In this preferred embodiment, the via stubs 252 have a substantially rounded shape, while the capacitive stubs 254 have a substantially rectangular shape. However, any suitable shape that brings portions of the power rail $V_{dd}$ ring 210 and the ground rail $V_{ss}$ ring 208 in close proximity to one another will have a beneficial capacitor coupling effect.

Accordingly, the exposed surface areas provided by the pluralities of extension spokes 250, via stubs 252 and capacitive stubs 254 provide a capacitance between the ground rail $V_{ss}$ ring 208 and the power rail $V_{dd}$ ring 210 that is substantially evenly distributed around the semiconductor chip 204. A major advantage of even distribution is that the on-chip driver circuitry will be able to access about the same amount of stored charge from any point around the capacitive network of the ground rail $V_{ss}$ ring 208 and the power rail $V_{dd}$ ring 210. This has the benefit of increasing the speed at which the semiconductor chip's 104 circuitry switch. And of course, this provides a higher performance package, which can enhance the operational and performance levels on any chip that may be packaged thereon.

Additionally, by increasing the exposed surface area between the two rings, the bypass capacitive network 200 effectively increases the capacitive coupling between the rings at higher frequencies. Because the bypass capacitive network 200 can be utilized without adding any discrete elements to the semiconductor package, the decoupling capacitive effect can be increased without being limited by a lack of mounting space on the package substrate surface. The bypass capacitive network 200 also substantially reduces the amount of impedance encountered between the two rings at high frequencies. This is a substantial improvement over the very large prior art impedance levels, which are inherent in the discrete component wiring at high frequencies.

FIG. 2B shows a more detailed view 260 of the bypass capacitive network 200 of FIG. 2A. Extension spoke 250 is divided into a stem portion 250a and a head portion 250b. In this exemplary view 260, some of the typical dimensions of the elements in the bypass capacitive network 200 are shown. The distance ($W_R$) between the ground rail $V_{ss}$ ring and the power rail $V_{dd}$ ring is about 1.5 millimeters, and can range between about 0.5 millimeters and about 3 millimeters. The width ($W_{Vss}$) of the ground rail $V_{ss}$ ring and the width ($W_{Vdd}$) of the power rail $V_{dd}$ ring measure about 0.25 millimeters. The width ($W_S$) of the stem portion 250a is about 0.1 millimeters. The width ($W_H$) of the head portion 250b is about 0.25 millimeters.

Furthermore, the length ($L_H$) of the head portion 250b may be about 0.75 millimeters. Also shown are respective distances $d_1$, $d_2$, and $d_3$, which identify several distance separations between the complementary extension features of the bypass capacitive network. In this example, $d_1$ may be about 0.1 millimeters, $d_2$ may be about 0.1 millimeters, and $d_3$ may be about 0.1 millimeters. Of course, these dimensions are only exemplary dimensions which will work for current technology etching techniques.

FIG. 3A shows a simplified partial top view of an alternative preferred embodiment of a bypass capacitive network 300. In this preferred embodiment, a semiconductor chip 204 is mounted on a package substrate (not shown for ease of illustration), which can be a ball grid array (BGA) package substrate, or a pin grid array (PGA) package substrate. The semiconductor chip 204 is connected to a ground rail $V_{ss}$ ring 208' and a power rail $V_{dd}$ ring 210' through respective bond wires 205a and 205b.

A first plurality of extension spokes 250' are designed to bring a portion of the ground rail $V_{ss}$ ring 208' toward the power rail $V_{dd}$ ring 210', and a second plurality of extension spokes 250' are designed to bring a portion of the power rail $V_{dd}$ ring 210' toward the ground rail $V_{ss}$ ring. As in the previous embodiment, both pluralities of extension spokes 250' enable the complementary exposure of a much greater surface area between the two rings, which collectively act as a well distributed network of capacitive plates. Again, this is because the capacitance between two parallel conductors is substantially proportional to the total surface area exposed between them. In this alternate preferred embodiment, the extension spokes 250' are shown to be substantially rectangular extensions that are interposed between one another in a complementary comb orientation.

A first plurality of via bulbs 256b extend away from the ground rail $V_{ss}$ ring 208' toward the power rail $V_{dd}$ ring 210, and a second plurality of via bulbs 256b extend away from the power rail Vdd ring 210 toward the ground rail Vss ring 208'. Conductive vias 230 and 232 are defined on both the first and the second plurality of via bulbs 256b. As shown, both pluralities of via bulbs 256b have head stubs 256a that extend outwardly from the via bulbs 256b. Together, the via bulbs 256b and head stubs 256a provide an additional level of exposed complementary surfaces areas, which further add to the capacitive network formed by the extension spokes 250'. In some portions of the $V_{ss}$ and $V_{dd}$ rings, such as the corner regions, the two head stubs 256a are placed in close proximity to one another in order to maximize the decoupling capacitive effect. Furthermore, in some designs it may be desirable to have more or less conductive vias 230/232, which may increase or decrease the number of complementary extension spokes 250' lying between conductive vias.

FIG. 3B shows a more detailed view 260' of the alternative bypass capacitive network 300 of FIG. 3A. In this exemplary view 260', some of the typical dimensions of the elements in the bypass capacitive network 300 are shown. The distance ($W_R$) between the ground rail $V_{ss}$ ring and the power rail $V_{dd}$ ring is preferably about 1.5 millimeters, and can range between about 0.5 millimeters and about 3 millimeters. The width ($W_{Vss}$) of the ground rail $V_{ss}$ ring and the width ($W_{Vdd}$) of the power rail $V_{dd}$ ring measure about 0.25 millimeters. The width ($W_s'$) of the head stubs 256a is about 0.1 millimeters. The width ($W_H$) of the head stubs 258a is about 0.1 millimeters.

Also shown are respective distances $d_1$, $d_2$, and $d_3$, which identify several distance separations between the complementary extension features of the bypass capacitive network. In this example, $d_1$ may be about 0.1 millimeters, $d_2$ may be about 0.1 millimeters, and $d_3$ may be about 0.1 millimeters. Of course, these dimensions are only exemplary dimensions which will work for current technology etching techniques.

The above described invention may be further understood with reference to a flow chart presented in FIG. 4. The flow chart encompasses a basic method 400 of making a semiconductor package having capacitive extension features for increasing capacitive coupling between a power rail ring and a ground rail ring. The method 400 begins at an operation 402 where a top conductive layer is provided over a multi-layer semiconductor package. The top conductive layer typically incorporates a power rail and a ground rail which are defined as rings that surround a pad that is configured to receive a semiconductor chip. The top conductive layer also typically includes a plurality of conductive traces that help in interconnecting the semiconductor chip to, for example, solder balls that make electrical interconnection to a printed circuit board.

In operation 404, spokes are designed to be electrical extensions of both the power and ground rail rings. Once the desired geometric pattern and layout has been ascertained to meet the desired performance characteristics for a particular device, the top conductive layer is patterned with the designed spokes to introduce an increased coupling capacitance between the designed spokes in operation 406. In one preferred orientation, the spokes are rectangular in nature and extend outwardly from one rail towards the other.

In one embodiment, the spokes can be interposed, one between another forming a comb pattern. In another embodiment, the spokes are substantially T shaped and also interposed one between the other. In yet another embodiment, the spokes can be bulb shaped to accommodate vias that may be defined through them. However, it should be noted that any design that will increase the exposed surface area between the power and ground rails can be used to increase the coupling capacitance of the system.

In operation 408, a semiconductor chip is attached to the multi-layer semiconductor package and interconnected to the power rail and the ground rail. Typically, the semiconductor chip has a plurality of bond pads that are interconnected to the rails using a suitable bond wiring technique. The spokes of the top conductive layer are preferably patterned in a manner that distributes the coupling capacitance evenly around the semiconductor chip, such that any type of switching circuitry designed on the semiconductor chip can have rapid access to the stored charges that lie between the capacitive network. At this point, the remaining common packaging operations, such as, encapsulation, singulation and integration into larger system can be completed.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A pair of conductive rings defined in a semiconductor package, comprising:

a ground rail ring being defined around a semiconductor die pad that is configured to receive a semiconductor die, the ground rail ring having a first plurality of extension spokes that extend away from the ground rail ring; and a power rail ring being defined around the semiconductor die pad, the power rail ring having a second plurality of extension spokes that extend away from the power rail ring and toward the ground rail ring; wherein the first plurality of extension spokes extend toward the power rail ring: and wherein the ground rail ring and the power rail ring each have a plurality of via stubs that extend to one of a plurality of capacitive stubs and a complementary plurality of via stubs.

2. A pair of conductive rings defined in a semiconductor package as recited in claim 1, wherein the semiconductor package further includes:

a ground plane; and a power plane.

3. A pair of conductive rings defined in a semiconductor package as recited in claim 2, wherein the plurality of via stubs and the complementary plurality of via stubs are configured to interconnect the ground rail ring and the power rail ring to the ground plane and the power plane.

4. A pair of conductive rings defined in a semiconductor package as recited in claim 1, wherein each via stub includes a capacitive extension.

5. A pair of conductive rings defined in a semiconductor package, comprising:

a ground rail ring being defined around a semiconductor die pad that is configured to receive a semiconductor die, the ground rail ring having a first plurality of extension spokes that extend away from the ground rail ring;

a power rail ring being defined around the semiconductor die pad, the power rail ring having a second plurality of extension spokes that extend away from the power rail ring and toward the ground rail ring; and a plurality of via stubs, each of which have a capacitive extension;

wherein the first plurality of extension spokes extend toward the power rail.

6. A pair of conductive rings defined in a semiconductor package as recited in claim 5, wherein each via stub of the plurality of via stubs has a first width that is greater than a second width of the capacitive extension.

7. A power and ground providing structure defined in a semiconductor package, comprising:

a ground ring means being defined around a semiconductor die pad that is configured to receive a semiconductor die, the ground ring means having a first plurality of extension spokes that extend away from the ground ring means; and a power ring means being defined around the semiconductor die pad, the power ring means having a second plurality of extension spokes that extend away from the power ring means and toward the ground ring means; wherein the first plurality of extension spokes extend toward the power ring means; and wherein the ground ring means and the power ring means each have a plurality of via stubs that extend to one of a plurality of capacitive stubs and a complementary plurality of via stubs.

8. A power and ground providing structure defined in a semiconductor package as recited in claim 7, wherein the semiconductor package further includes:

a ground plane means; and a power plane means.

* * * * *